(12) United States Patent
Heinrich et al.

(10) Patent No.: US 8,329,526 B2
(45) Date of Patent: Dec. 11, 2012

(54) CAP REMOVAL IN A HIGH-K METAL GATE ELECTRODE STRUCTURE BY USING A SACRIFICIAL FILL MATERIAL

(75) Inventors: Jens Heinrich, Wachau (DE); Frank Seliger, Dresden (DE); Ralf Richter, Dresden (DE); Markus Lenski, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 12/905,655

(22) Filed: Oct. 15, 2010

(65) Prior Publication Data

US 2011/0129980 A1 Jun. 2, 2011

(30) Foreign Application Priority Data

Nov. 30, 2009 (DE) .......................... 10 2009 047 309

(51) Int. Cl.
*H01L 21/336* (2006.01)
*H01L 21/8234* (2006.01)
*H01L 21/8238* (2006.01)

(52) U.S. Cl. ........ 438/197; 438/229; 438/230; 438/275; 438/283; 438/303; 257/E21.431; 257/E21.634; 257/E21.636; 257/E21.64

(58) Field of Classification Search ........... 257/E21.431, 257/E21.634, E21.636, E21.64
See application file for complete search history.

(56) References Cited

U.S. PATENT DOCUMENTS

| | | | |
|---|---|---|---|
| 7,425,490 B2 | 9/2008 | Kavalieros et al. | 438/299 |
| 7,754,555 B2 * | 7/2010 | Gehring et al. | 438/199 |
| 7,943,462 B1 * | 5/2011 | Beyer et al. | 438/230 |
| 7,981,740 B2 * | 7/2011 | Lenski et al. | 438/229 |
| 8,258,053 B2 * | 9/2012 | Kronholz et al. | 438/595 |
| 8,258,062 B2 * | 9/2012 | Richter et al. | 438/689 |
| 2005/0282341 A1 | 12/2005 | Park et al. | 438/283 |
| 2007/0122955 A1 | 5/2007 | Luo et al. | 438/197 |
| 2011/0101427 A1 * | 5/2011 | Scheiper et al. | 257/288 |
| 2011/0129972 A1 * | 6/2011 | Hoentschel et al. | 438/231 |

FOREIGN PATENT DOCUMENTS

DE  102006030264 A1  1/2008

OTHER PUBLICATIONS

Gehring et al., English Machine Translated of DE Publication No. DE102006030264A1, Jan. 3, 2003; (Machine Translated Apr. 29, 2012).*
Translation of Official Communication from German Patent Office for German Patent Application No. 10 2009 047 309.2 dated Aug. 19, 2010.

* cited by examiner

*Primary Examiner* — Mohsen Ahmadi
(74) *Attorney, Agent, or Firm* — Williams, Morgan & Amerson, P.C.

(57) ABSTRACT

Dielectric cap layers of sophisticated high-k metal gate electrode structures may be efficiently removed on the basis of a sacrificial fill material, thereby reliably preserving integrity of a protective sidewall spacer structure, which in turn may result in superior uniformity of the threshold voltage of the transistors. The sacrificial fill material may be provided in the form of an organic material that may be reduced in thickness on the basis of a wet developing process, thereby enabling a high degree of process controllability.

17 Claims, 6 Drawing Sheets

CAP REMOVAL IN A HIGH-K METAL GATE ELECTRODE STRUCTURE BY USING A SACRIFICIAL FILL MATERIAL

BACKGROUND OF THE INVENTION

1. Field of the Invention

Generally, the present disclosure relates to the fabrication of highly sophisticated integrated circuits including transistor elements that comprise a high-k metal gate electrode structure formed in an early process stage.

2. Description of the Related Art

The fabrication of advanced integrated circuits, such as CPUs, storage devices, ASICs (application specific integrated circuits) and the like, requires a great number of circuit elements to be formed on a given chip area according to a specified circuit layout, wherein field effect transistors represent one important type of circuit element that substantially determines performance of the integrated circuits. A plurality of process technologies are practiced, wherein, for many types of complex circuitry, including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a planar transistor architecture, on the distance between the source and drain regions, which is also referred to as channel length.

Presently, the vast majority of integrated circuits are formed on the basis of silicon due to its substantially unlimited availability, the well-understood characteristics of silicon and related materials and processes and the experience gathered during the past 50 years. Therefore, silicon will likely remain the material of choice for future circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a base material for gate insulation layers that separate the gate electrode, frequently comprised of polysilicon, from the silicon channel region. In steadily improving device performance of field effect transistors, the length of the channel region has been continuously decreased to improve switching speed and drive current capability. Since the transistor performance is controlled by, among other things, the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length for a planar transistor configuration requires an increased capacitive coupling, in combination with sophisticated lateral and vertical dopant profiles in the drain and source regions, to avoid the so-called short channel behavior during transistor operation. The short channel behavior may lead to an increased leakage current and to a pronounced dependence of the threshold voltage on the channel length. Aggressively scaled planar transistor devices with a relatively low supply voltage and thus reduced threshold voltage may suffer from an exponential increase of the leakage current due to the required enhanced capacitive coupling of the gate electrode to the channel region. Thus, the thickness of the silicon dioxide layer has to be correspondingly reduced to provide the required capacitance between the gate and the channel region. For example, a channel length of approximately 0.08 μm may require a gate dielectric made of silicon dioxide as thin as approximately 1.2 nm. Although usage of high speed transistor elements having an extremely short channel may typically be restricted to high speed applications, whereas transistor elements with a longer channel may be used for less critical applications, such as storage transistor elements, the relatively high leakage current caused by the direct tunneling of charge carriers through an ultra-thin silicon dioxide gate insulation layer may reach values for an oxide thickness in the range of 1-2 nm that may no longer be compatible with requirements for many types of circuits.

For this reason, new strategies have been developed in overcoming the limitations imposed by high leakage currents of extremely thin silicon oxide-based gate insulation layers. One very promising approach is the replacement of the conventional dielectric materials, at least partially, by dielectric materials having a dielectric constant that is significantly greater than the dielectric constant of silicon dioxide-based materials. For example, dielectric materials, also referred to as high-k dielectric materials, with a dielectric constant of 10.0 and significantly higher, may be used, for instance in the form of hafnium oxide, zirconium oxide and the like. In addition to providing a high-k dielectric material in the gate insulation layers, appropriate metal-containing materials may also have to be incorporated since the required work function values for P-channel transistors and N-channel transistors may not be obtained on the basis of standard doped polysilicon gate materials. To this end, appropriate metal-containing materials may be provided so as to cover the sensitive high-k dielectric materials and act as a source for incorporating an appropriate metal species, such as lanthanum, aluminum and the like, in order to appropriately adjust the work function for N-channel transistors and P-channel transistors, respectively. Furthermore, due to the presence of a metal-containing conductive material, the generation of a depletion zone, as may typically occur in polysilicon-based electrode materials, may be substantially avoided. The process of fabricating a sophisticated gate electrode structure on the basis of a high-k dielectric material may require a moderately complex process sequence due to, for instance, the adjustment of an appropriate work function for the transistors of different conductivity type and the fact that high-k dielectric materials may typically be very sensitive when exposed to certain process conditions, such as high temperatures in the presence of oxygen and the like. Therefore, different approaches have been developed, such as providing the high-k dielectric material at an early manufacturing stage and processing the semiconductor devices with a high degree of compatibility with standard process techniques, wherein the typical electrode material polysilicon may be replaced in a very advanced manufacturing stage with appropriate metals for adjusting the work function of the different transistors and for providing a highly conductive electrode metal. While this approach may provide superior uniformity of the work function and thus of the threshold voltage of the transistors, since the actual adjustment of the work function may be accomplished after any high temperature processes, a complex process sequence for providing the different work function metals in combination with the electrode metal may be required. In other very promising approaches, the sophisticated gate electrode structures may be formed in an early manufacturing stage, while the further processing may be based on the plurality of well-established process strategies. In this case, the high-k dielectric material and any metal species for adjusting the work function may be provided prior to or upon patterning the gate electrode stack, which may comprise well-established materials, such as silicon and silicon/germanium, thereby enabling the further processing on the basis of well-established process techniques. On the other hand, the gate electrode stack and, in particular, the sensitive high-k dielectric materials, in combination with any metal-containing cap layers, may remain reliably confined by appropriate materials throughout the entire processing of the semiconductor device.

Further concepts for enhancing performance of transistors have been developed by providing a plurality of strain-inducing mechanisms in order to increase the charge carrier mobility in the channel regions of the various transistors. It is well known that charge carrier mobility in silicon may be efficiently increased by applying certain strain components, such as tensile and compressive strain for N-channel transistors and P-channel transistors, respectively, so that superior transistor performance may be obtained for an otherwise identical transistor configuration compared to non-strained silicon materials. For instance, efficient strain-inducing mechanisms may be implemented by incorporating a strained semiconductor material in the drain and source regions of transistors, for instance in the form of a silicon/germanium alloy, a silicon/carbon alloy and the like, wherein the lattice mismatch between the semiconductor alloy and the silicon base material may result in a tensile or compressive state, which in turn may induce a desired type of strain in the channel region of the transistor. Other efficient strain-inducing mechanisms are well established in which a highly stressed dielectric material may be positioned in close proximity to the transistor, thereby also inducing a certain type of strain in the channel region.

Although the approach of providing a sophisticated high-k metal gate electrode structure in an early manufacturing stage, possibly in combination with additional strain-inducing mechanisms, may have the potential of providing extremely powerful semiconductor devices, such as CPUs, storage devices, systems on a chip (SoC) and the like, conventional approaches may still suffer from process non-uniformities, as will be described with reference to FIGS. 1a-1f.

Figure 1A:
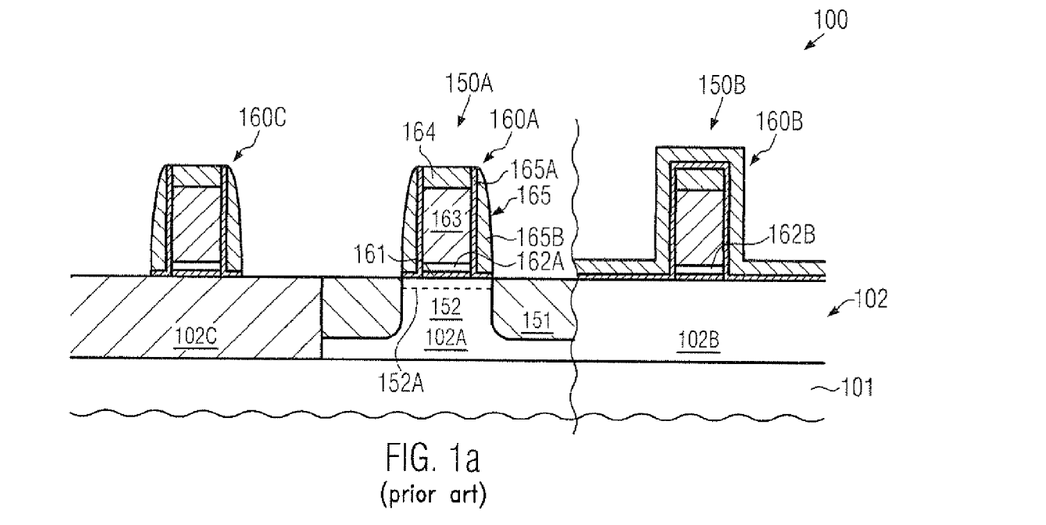
FIGS. 1a-1f schematically illustrate cross-sectional views of a semiconductor device during various manufacturing stages in forming a sophisticated high-k metal gate electrode structure in combination with a strain-inducing material on the basis of a conventional strategy in which integrity of the gate electrode structure is to be preserved on the basis of a sidewall spacer structure in combination with a sacrificial oxide spacer.

FIG. 1a schematically illustrates a cross-sectional view of a semiconductor device 100 comprising a substrate 101, such as a silicon substrate, in combination with a semiconductor layer 102, such as a silicon layer or a semiconductor material comprising a significant amount of silicon. In the manufacturing stage shown, the semiconductor device 100 further comprises transistors 150A, 150B in an early manufacturing stage, which may be formed in and above an active region 102A and 102B, respectively. An active region is to be understood as a semiconductor region in the layer 102 in which PN junctions for one or more transistors are to be formed. An isolation structure 102C, such as a trench isolation, is provided in the semiconductor layer 102 and may laterally delineate active regions, such as the regions 102A, 102B. Furthermore, a plurality of gate electrode structures 160A, 160B and 160C may be formed above the semiconductor layer 102. In FIG. 1a, the gate electrode structures 160A, 160B are illustrated at a cross-section in which the gate electrode structures 160A, 160B are formed on the active regions 102A and 102B, respectively, wherein it should be appreciated that these gate electrode structures may extend beyond the corresponding active region, if required, and may thus be formed above a corresponding isolation region. For example, the gate electrode structure 160C may represent a corresponding portion of a gate electrode structure or may represent a conductive line or any other circuit element, such as a resistive structure and the like, which may have a similar configuration as the gate electrode structures 160A, 160B. As previously discussed, the gate electrode structures may comprise a gate insulation layer 161 formed on the active region 102A and 102B, respectively, and may comprise a high-k dielectric material such as hafnium oxide-based materials and the like. It should be appreciated that the gate insulation layer 161 may additionally comprise a conventional dielectric material, such as a silicon oxide-based material, however, with a significantly reduced thickness of approximately 0.8 nm and less. Consequently, in total, the gate insulation layer 161 may have a thickness of 1.5 nm and more, while still providing an oxide equivalent thickness that may be 1 nm and less, while leakage currents may be significantly less compared to a conventional extremely thin silicon oxide-based material. Moreover, a metal-containing material may be formed on the gate insulation layer 161 and may have a different composition for transistors of different conductivity type. For example, a conductive cap layer 162A may be provided in the gate electrode structure 160A including a work function adjusting species for the transistor 150A, while a conductive cap layer 162B including a work function species for the transistor 150B may be applied in the gate electrode structure 160B. Typically, the gate electrode structure 160C may have one of the layers 162A, 162B. Moreover, an electrode material 163, such as silicon, silicon/germanium and the like, may be formed above the conductive cap layers 162A, 162B, respectively, followed by a dielectric cap layer 164, which is typically comprised of silicon nitride.

Furthermore, a sidewall spacer structure 165, which may comprise an optional liner material 165A and a spacer element 165B may be provided so as to protect the sidewalls of the electrode material 163 and in particular side faces of the sensitive materials 162A, 162B, 161. The liner 165A and the spacer element 165B may typically be comprised of silicon nitride. As illustrated, above the active region 102B and the gate electrode structure 160B, the materials 165A, 165B may be in the form of non-patterned layers in order to provide a growth mask for forming a strain-inducing semiconductor material 151 in the active region 102A so as to increase the charge carrier mobility in a channel region 152 of the transistor 150A. Moreover, the active region 102A may comprise a semiconductor alloy 152A in the channel region 152, for instance a silicon/germanium alloy, in order to adjust the band gap offset of the channel region, thereby obtaining a desired threshold voltage, in combination with the materials 161 and 162A, for the transistor 150A.

As previously discussed, the semiconductor alloy 151, for instance provided in the form of a silicon/germanium alloy, may have a strained state and may thus induce a desired strain in the channel region 152. For instance, silicon/germanium may represent a very efficient strain-inducing source for P-channel transistors.

The semiconductor device 100 as illustrated in FIG. 1a may be formed on the basis of the following conventional process strategies. After forming the isolation region 102C and thus delineating the active regions 102A, 102B, the material layer 152A may be selectively formed in the active region 102A. Next, appropriate materials for the gate insulation layer 161 and one of the layers 162A and 162B may be formed by any appropriate deposition technique. Thereafter, the conductive cap material may be appropriately patterned and the other one of the layers 162A, 162B is deposited, possibly followed by any heat treatments in order to appropriately diffuse a work function adjusting species towards the gate insulation layer 161. Prior to or after the corresponding adjustment of the work function, the electrode material 163, for instance in the form of silicon, may be deposited on the basis of well-established deposition techniques, followed by the deposition of the dielectric cap layer 164. Furthermore, additional materials, such as hard mask materials and the like, may be provided if required and thereafter a sophisticated lithography process and an anisotropic etch sequence may be performed in order to form the gate electrode structures 160A, 165B, 160C. During the patterning process, the dielectric cap layer 164 may thus provide superior efficiency of the pattering process and may also be used during the subsequent processing so as to cap the electrode material 163. As previously discussed, in sophisticated applications, a length of the gate electrode structures 160A, 160B, 160C, i.e., in FIG. 1a, a horizontal extension of the electrode material 163, may be 50 nm and less. Next, one or both of the materials 165A, 165B may be formed, for instance, by thermally activated chemical vapor deposition (CVD) techniques, plasma enhanced CVD techniques and the like, in order to form a very dense silicon nitride material so as to reliably confine the sidewalls of the gate electrode structure.

As is well known, during the further manufacturing process, many types of reactive processes have to be applied, such as cleaning recipes, mainly based on inorganic acids in combination with oxidizing agents, such as sulfuric acid/hydrogen peroxide, hydrofluoric acid and the like, plasma strip and dry etch chemistries. During these processes, integrity of the spacer 165 should be preserved as much as possible in order to protect the sensitive materials 161, 162A, 162B, since, otherwise, a significant threshold shift or even a total device failure may occur.

Thereafter, an etch mask may be provided so as to cover the transistor 150B in order to form the spacer elements 165B and possibly etch into the active region 102A in order to form corresponding cavities therein. During the corresponding etch process, the spacer structure 165 may substantially determine a lateral offset of the corresponding cavities with respect to the channel region 152. Next, a selective epitaxial growth process is performed in order to grow the strain-inducing semiconductor material 151. During a selective epitaxial growth process, process parameters are adjusted such that a significant material deposition on dielectric surface areas, such as the cap layers 164, the material 165B and the isolation region 102C, is substantially suppressed. The resulting strain component may strongly depend on the lateral offset of the material 151 from the channel region 152 and thus on the width of the spacer structure 165.

Figure 1B:
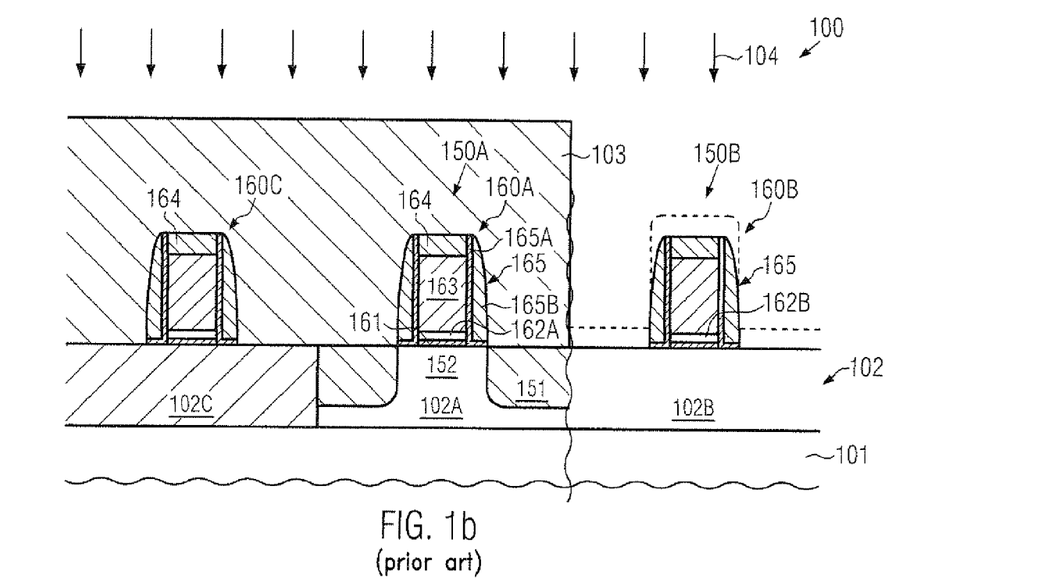

FIG. 1b schematically illustrates the semiconductor device 100 in a manufacturing stage in which an etch mask 103 covers the active region 102A and possibly the isolation region 102C, while exposing the gate electrode structure 160B and the active region 102B. Moreover, an etch process 104 is applied so as to obtain the spacer structure 165 on sidewalls of the gate electrode structure 160B. For this purpose well-established plasma assisted etch recipes are applied. It should be appreciated that, during the etch process 104, a certain amount of material erosion in the active region 102B or material modification may occur, depending on the etch chemistry used. For example, plasma assisted etch recipes for removing silicon nitride may exhibit a self-limiting behavior when etching a silicon material, which may be caused by the generation of silicon dioxide that may then act as an efficient etch stop material.

Thereafter, the etch mask 103 may be removed and thus the gate electrode structures 160A, 160B, 160C may have a substantially similar configuration, i.e., they comprise the sidewall spacer structure 165, which may be used as an offset spacer structure for controlling a subsequent implantation sequence for introducing dopant species so as to form drain and source extension regions and halo regions, i.e., counter-doped regions, in order to obtain the required complex dopant profile for adjusting the overall transistor characteristics. During the further processing, the dielectric cap layers 164 also have to be removed so as to enable forming a metal silicide therein and to incorporate a desired dopant concentration. The removal of the cap layers 164 may, however, have a significant influence on the resulting device topography and thus on the resulting transistor characteristics. For instance, upon removing the dielectric cap material 164, etch chemistries, such as hot phosphoric acid, are typically applied which, however, may exhibit a significant lateral etch rate, thereby causing a significant degree of material erosion of the spacer structure 165. For this reason, the spacer structure 165 is protected by providing a sacrificial oxide spacer element having a high etch resistivity with respect to hot phosphoric acid.

Figure 1C:
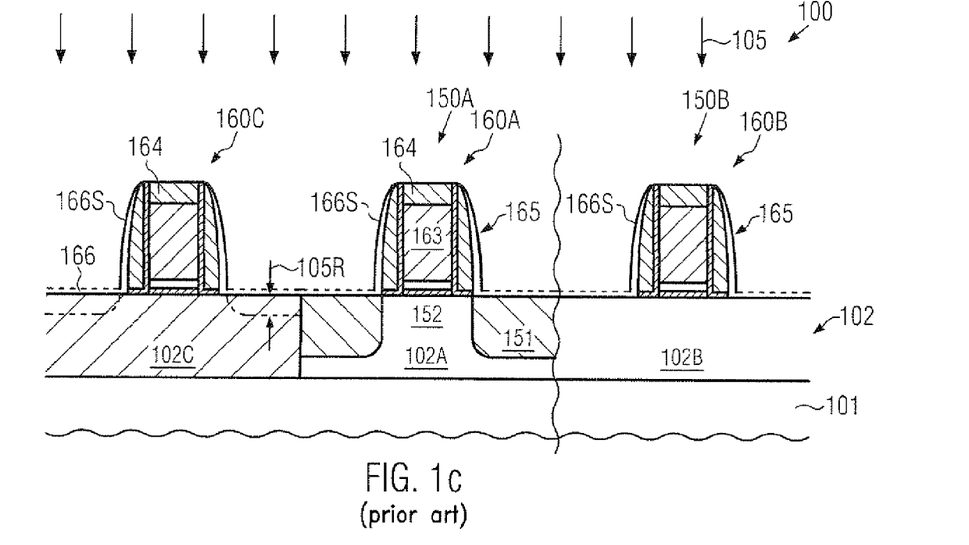

FIG. 1c schematically illustrates the semiconductor device 100 with an oxide spacer layer 166, which is etched during an etch process 105 in order to form sacrificial oxide spacers 166S on the sidewall spacer structure 165. Consequently, during the etch process 105, a certain degree of material erosion 105R may occur in the isolation structure 102C due to a certain required overetch time.

Figure 1D:
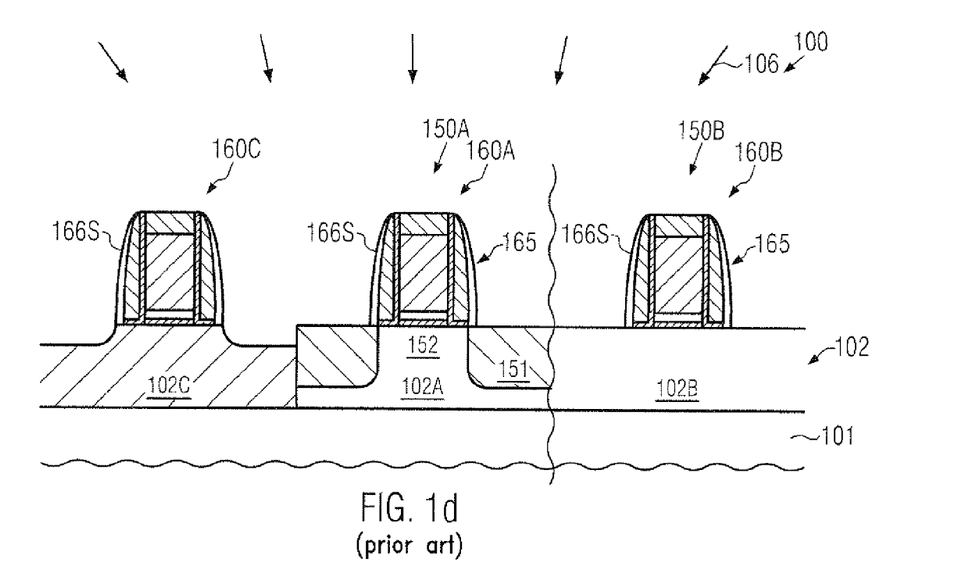

FIG. 1d schematically illustrates the device 100 when exposed to a further etch process 106 for removing the dielectric cap material 164 (FIG. 1c) on the basis of hot phosphoric acid. As discussed above, during the etch process 106 the silicon nitride spacer structure 165 is protected by the sacrificial spacer elements 166S.

Figure 1E:
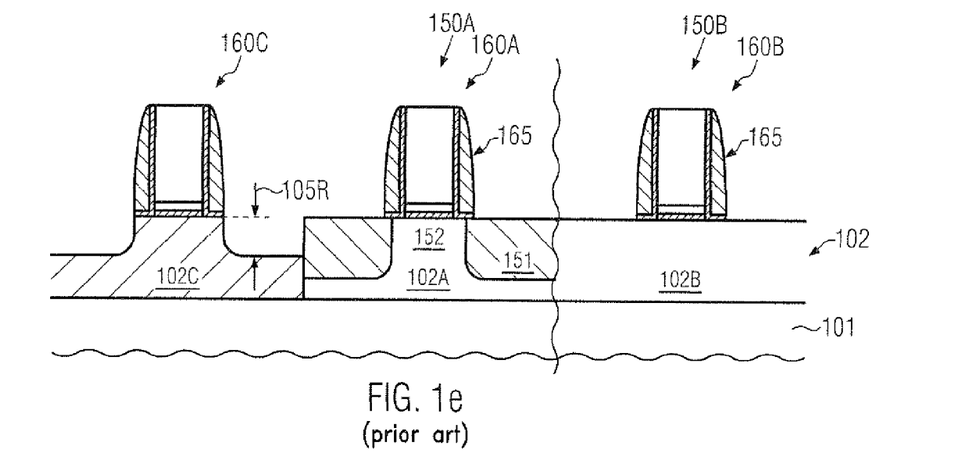

FIG. 1e schematically illustrates the semiconductor device 100 in a further advanced manufacturing stage. As illustrated, the sacrificial sidewall spacers 166S (FIG. 1d) are removed, which may be accomplished on the basis of diluted hydrofluoric acid (HF), which, however, may also remove a further portion of the isolation structure 102C, thereby increasing the recess 105R. Consequently, after the removal of the dielectric cap layer, a pronounced surface topography, in the form of the recess 105R and recesses in the active regions 102A, 102B (not shown), is created, which may have a significant influence on the further processing.

Figure 1F:
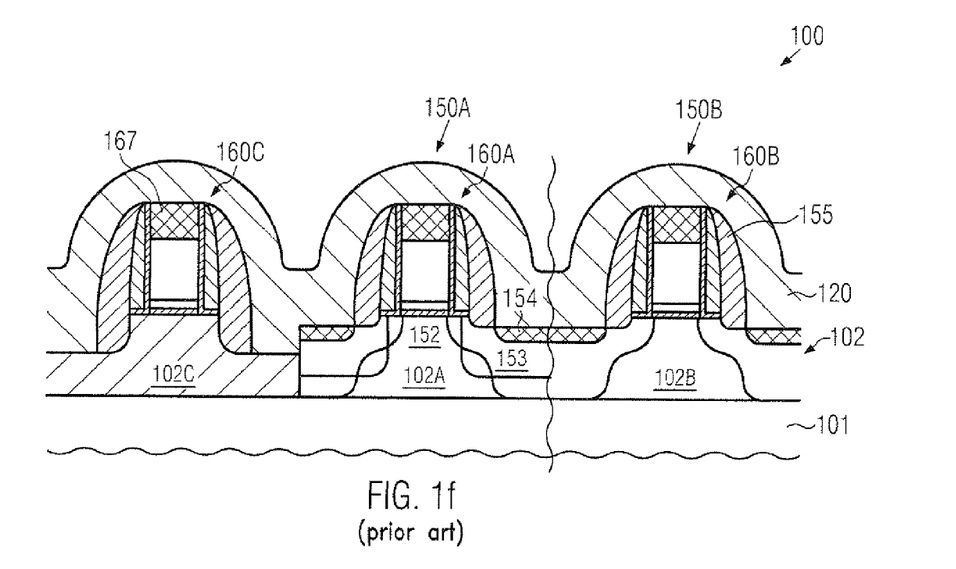

FIG. 1f schematically illustrates the semiconductor device 100 in a further advanced manufacturing stage. As illustrated, a further sidewall spacer structure 155 is formed adjacent to the spacer structure 165 (FIG. 1e) and is typically comprised of silicon nitride, possibly in combination with a silicon dioxide etch stop liner (not shown). Furthermore, drain and source regions 153 are formed in the active regions 102A, 102B corresponding to the conductivity type of the transistors 150A, 150B. Furthermore, metal silicide regions 154 are formed in the drain and source regions 153 and metal silicide regions 167 are provided in the gate electrode structures 160A, 160B, 160C. Additionally, a dielectric layer 120 which may have a high internal stress level is formed above the active regions 102A, 102B, the isolation region 102C and above the gate electrode structures 160A, 160B, 160C. As previously explained, a highly stressed dielectric material provided in the vicinity of a channel region of a transistor may represent an efficient strain-inducing mechanism, wherein the resulting amount of transistor performance enhancement may strongly depend on the internal stress level of the layer 120 and the amount of highly stressed material positioned in close proximity to the channel region 152, which in turn may thus depend on the thickness of the layer 120. Consequently, in view of enhancing transistor performance, an increased layer thickness is highly desirable for the layer 120, which, however, may be restricted by the pronounced surface topography, in particular in the isolation region 102C. That is, in device areas comprising closely spaced gate electrode structures extending along an isolation region, such as the region 102C, the pronounced recessing caused by the previous processing may additionally increase the resulting aspect ratio that is "seen" during the deposition of the material 120. Consequently, in view of the pronounced recessing of the isolation structure 102C, a reduced thickness of the layer 120 may have to be provided in order to avoid deposition-related irregularities, which may otherwise result in significant yield losses during the further processing, for instance when forming contact elements and the like.

The semiconductor device 100 as illustrated in FIG. 1g may be formed in accordance with the following process techniques. The spacer structure 155 is typically formed by depositing a silicon nitride material, possibly in combination with a silicon dioxide etch stop liner, and patterning the silicon nitride layer so as to obtain a spacer element, as shown. Prior to and after forming the sidewall spacer structure 155, implantation processes are performed in order to introduce dopant species, thereby forming the drain and source regions 153. After any anneal processes in which the final dopant profile may be established, further cleaning processes are performed in order to prepare the exposed semiconductor surface areas for forming the metal silicide regions 154, 167. Typically, during any such cleaning processes, a further recessing in the isolation region 102C may be caused, thereby further contributing to the very pronounced surface topography. Thereafter, a silicidation process may be performed, wherein the spacer structure 155 may substantially determine the lateral offset of the metal silicide regions 154 with respect to the channel region 152. Next, the dielectric material 120 is deposited wherein, depending on the process requirements, a complex deposition and patterning sequence may have to be applied when dielectric materials of different internal stress levels are to be provided above the transistor 150A and the transistor 150B. During the corresponding deposition process or processes, the pronounced surface topography has to be taken into consideration, as discussed above, thereby possibly reducing the efficiency of the strain-inducing effect of the dielectric material 120.

Although the conventional approach as described above may provide high performance transistors on the basis of the high-k metal gate electrode structures, the pronounced surface topography in the isolation regions, mainly caused by the removal of the dielectric cap layer, may result in reduced device performance and increased yield loss. Reducing the surface topography by omitting the sacrificial spacer element may, however, not be a promising approach since, in this case, additional device failures may occur due to the inferior integrity of the protective sidewall spacer. On the other hand, increasing the thickness of the protective sidewall spacer in view of increasing resistivity the spacer structure may be less than desirable, since, in this case, a significant reduction of overall performance gain obtained on the basis of an incorporated strain-inducing semiconductor material would have to be accepted.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing techniques in which the removal of a dielectric cap layer of sophisticated gate electrode structures may be realized on the basis of a superior surface topography without negatively affecting other transistor characteristics, such as the lateral offset of a strain-inducing semiconductor material. For this purpose, a sacrificial fill material may be applied laterally adjacent to the gate electrode structures so as to also cover the active regions and thus the lower portions of the gate electrode structures while efficiently removing the dielectric cap material. On the other hand, the sacrificial material may be efficiently removed on the basis of process techniques which may have a very high selectivity, in particular with respect to isolation structures. In some illustrative aspects disclosed herein, the sacrificial fill material may be removed on the basis of resist strip techniques, such as oxygen plasma and the like, which may have an extremely low effect on device areas, such as isolation structures, active regions and the like. In some illustrative embodiments disclosed herein, the sacrificial fill material may be provided in the form of a wet-developable material which may thus enable the removal of a portion of the sacrificial fill material for exposing the dielectric cap layer on the basis of a wet development process.

One illustrative method disclosed herein comprises forming a gate electrode structure of a transistor above a semiconductor region of a semiconductor device. The gate electrode structure comprises a gate insulation layer including a high-k dielectric material, a metal-containing cap material formed on the gate insulation layer, an electrode material formed above the cap material, a dielectric cap layer formed above the electrode material and a sidewall spacer structure. The method further comprises forming a sacrificial fill material above the semiconductor region and the gate electrode structure. Moreover, a portion of the sacrificial fill material is removed so as to expose at least a top surface of the dielectric cap layer. The method further comprises removing the dielectric cap layer in the presence of a remaining portion of the sacrificial fill material and removing the sacrificial fill material.

A further illustrative method disclosed herein relates to forming a transistor of a semiconductor device. The method comprises forming a gate electrode structure on an active region of the transistor, wherein the gate electrode structure comprises a high-k dielectric material, an electrode material, a dielectric cap layer and a sidewall spacer structure. The method additionally comprises forming a sacrificial fill material above the gate electrode structure and above the active region. Moreover, the method comprises exposing at least a portion of the dielectric cap layer by removing a portion of the sacrificial fill material by performing a wet developing process. Furthermore, the method comprises removing the dielectric cap layer selectively to a remaining portion of the sacrificial fill material and removing the remaining portion of the sacrificial fill material. Additionally, the method comprises forming drain and source regions in the active region.

A still further illustrative method disclosed herein relates to forming a semiconductor device. The method comprises forming a first gate electrode structure above a first active region and a second gate electrode structure above a second active region, wherein the first and second gate electrode structures comprise a dielectric cap layer. The method additionally comprises forming a first spacer structure from a spacer layer selectively on sidewalls of the first gate electrode structure and preserving a portion of the spacer layer so as to cover the second gate electrode structure and the second active region. Furthermore, the method comprises forming a strain-inducing semiconductor material in the first active region by using the first spacer structure, the portion of the spacer layer and the dielectric cap layer as a mask. Moreover, the method comprises forming a second spacer structure on sidewalls of the second gate electrode structure from the remaining portion of the spacer layer. A sacrificial fill material is formed so as to cover the first and second active regions and to laterally enclose the first and second gate electrode structures while exposing at least a portion of the dielectric cap layer. Moreover, the method comprises removing the dielectric cap layer from the first and second gate electrode structures by using the sacrificial fill material as an etch mask. Additionally, the sacrificial fill material is removed selectively to the first and second active regions and selectively to an isolation structure that laterally delineates the first and second active regions. Furthermore, drain and source regions are formed in the first and second active regions.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides manufacturing techniques in which the work function of sophisticated high-k metal gate electrode structures may be adjusted in an early manufacturing stage. Moreover, a high degree of threshold voltage stability may be achieved by reliably confining the sensitive gate materials by a protective sidewall spacer structure, which may have an appropriate spacer width so as to enable the formation of strain-inducing semiconductor material with a desired reduced lateral offset to the channel region of the transistors. At the same time, integrity of the spacer structure may be preserved during an etch process for removing the dielectric cap material of the gate electrode structures by providing an appropriate sacrificial fill material, which may have appropriate material characteristics so as to enable the removal of this material with a significantly reduced effect on other device areas, such as isolation structures, active regions and the like. To this end, a plurality of organic materials are available, which may also frequently be used as organic planarization layers, which may be applied on the basis of well-established spin-on techniques in a low viscous state, thereby obtaining a substantially planar surface after the deposition of the fill material. In some illustrative embodiments disclosed herein, the sacrificial fill material may represent a material that may become soluble in appropriate developing agents provided as wet chemical solutions, as may typically be used for developing resist materials and the like. Thus, by using photosensitive organic materials, a desired degree of material removal on the basis of an exposure dose and parameters of the development process, such as development time and the like, may provide well-controllable process conditions for exposing the dielectric cap material of the gate electrode structures, while reliably keeping the active regions and at least the lower portions of the gate electrode structures, and thus of the protective spacer structure, covered. Consequently, since the application of the sacrificial fill material and also the controllable removal of a portion of the fill material may be accomplished with a high degree of process uniformity, undue exposure of the sidewall spacer structure, in particular at the bottom of the gate electrode structures, may be reliably avoided during an etch process for removing dielectric cap material. For this purpose, any appropriate etch regime may be applied, for instance using wet chemical etch recipes based on hot phosphoric acid, or using plasma assisted etch processes based on an etch chemistry, as may typically be used for patterning silicon nitride-based spacer elements and the like. Thereafter, the sacrificial fill material may be efficiently removed, for instance, by an oxygen plasma or any other wet chemical removal recipes, which may frequently be applied for removing resist material, which may have a significantly reduced removal rate in silicon material, silicon dioxide material and the like. Consequently, removal of the sacrificial fill material results in a significantly reduced degree of recessing, in particular of isolation structures, compared to conventional strategies in which silicon dioxide spacer elements have to be provided and removed after etching the dielectric cap material.

With reference to FIGS. 2a-2f, further illustrative embodiments will now be described in more detail, wherein reference may also be made to FIGS. 1a-1f, if required.

Figure 2A:
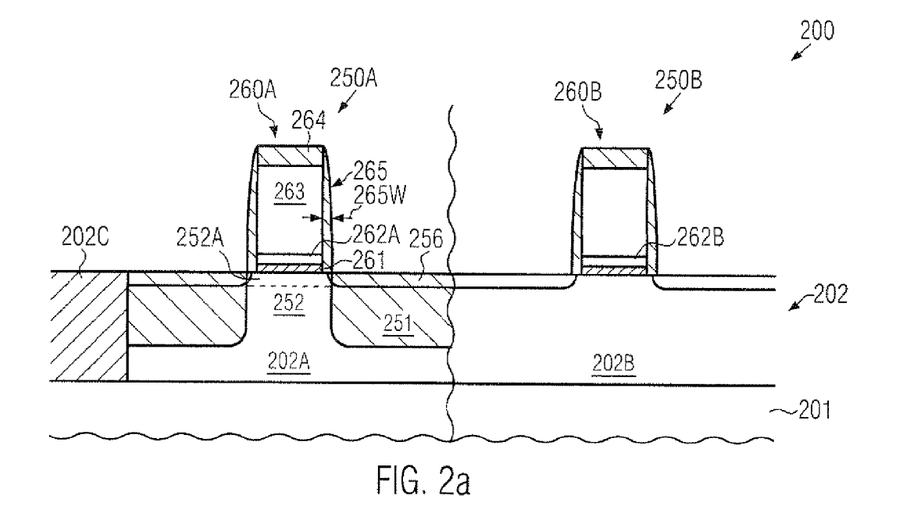
FIGS. 2a-2f schematically illustrate cross-sectional views of a semiconductor device during various manufacturing stages in which the dielectric cap material of sophisticated high-k metal gate electrode structures may be removed on the basis of a sacrificial fill material, thereby enhancing integrity of the sensitive gate materials, such as electrode materials including a work function adjusting metal species, according to illustrative embodiments.

FIG. 2a schematically illustrates a cross-sectional view of a semiconductor device 200 comprising a substrate 201 and a semiconductor layer 202. The substrate 201 and the semiconductor layer 202 may form a bulk configuration or an SOI configuration, as is also discussed above with reference to the device 100. In the semiconductor layer 202, active regions 202A, 202B may be laterally delineated by an isolation structure 202c, which may be comprised of silicon dioxide and the like. The active region 202A may represent the semiconductor region of a transistor 250A, such as a P-channel transistor. As previously explained with reference to the semiconductor device 100, the active region 202A may additionally comprise a threshold adjusting semiconductor material 252A, for instance in the form of a silicon/germanium material, in order to provide an appropriate band gap offset of a channel region 252. Furthermore, in the embodiment shown, a strain-inducing semiconductor material 251, such as a silicon/germanium alloy, a silicon/germanium/tin alloy and the like, may be provided so as to induce a desired type of strain in the adjacent channel region 252. For example, if a high compressive strain component is considered appropriate for enhancing performance of the transistor 250A, the above-identified materials may be efficiently applied. In other cases, a silicon/carbon semiconductor material may be provided in order to obtain a tensile strain component. Furthermore, in the manufacturing stage shown, the transistor 250A may comprise a gate electrode structure 260A including a gate dielectric material 261, in combination with a conductive cap material 262A, followed by an electrode material 263 and a dielectric cap layer 264. It should be appreciated that, for these components, the same criteria may apply as previously explained with reference to the semiconductor device 100. Hence, the gate dielectric material 261 may comprise any high-k dielectric material, depending on the overall device requirements. Similarly, the conductive cap material 262A may comprise any appropriate work function metal species, such as aluminum, which may be appropriate for adjusting the work function of the gate electrode structure 260A for a P-channel transistor. It should be appreciated that the work function metal species may be provided in an appropriate "carrier" material, such as titanium nitride and the like. Similarly, a gate electrode structure 260B may be provided on the active region 202B, which may represent the active region of an N-channel transistor 250B. Consequently, the gate electrode structure 260B may comprise a conductive cap material 262B, including an appropriate work function metal species, such as lanthanum, in order to obtain the desired work function. Moreover, the gate electrode structures 260A, 260B may comprise a protective sidewall spacer structure 265, for instance in the form of a single nitride spacer element, in the form of a liner material and the like, as is similarly also explained above with reference to the device 100. The spacer structure 265 may have an appropriate width 265W in order to appropriately determine the lateral offset of the strain-inducing material 251 from the channel region 252. That is, as discussed above, the magnitude of the strain component in the channel region 252 may strongly depend on the lateral offset of the material 251, which in turn may be determined by the width 265W, since the spacer structure 265 may act as an etch and growth mask when forming corresponding cavities in the active region 202A and refilling the cavities with the material 251. Consequently, a reduced width 265W may be advantageous and may be selected to be approximately 10 nm and less, such as 5 nm and less.

The semiconductor device 200 as illustrated in FIG. 2a may be formed on the basis of process techniques as are also described above with reference to the semiconductor device 100 when referring to FIGS. 1a and 1b. Consequently, a detailed description of the corresponding process techniques may be omitted here.

In some illustrative embodiments, as illustrated in FIG. 2a, implantation processes may be performed in the presence of the dielectric cap layer 264, for instance for incorporating dopant species for forming drain and source extension regions 256 and also forming counter-doped regions or halo regions (not shown), wherein the cap material 264 may efficiently increase the ion blocking capability of the gate electrode structures 260A, 260B. In other illustrative embodiments, when an exposure of the spacer structure 265 to the various resist removal processes and cleaning processes, which are typically associated with the implantation sequences for forming extension regions and halo regions, is considered inappropriate, the further processing may be continued without forming extension regions and halo regions. In this case, a similar process strategy may be applied as previously described with reference to the device 100.

Figure 2B:
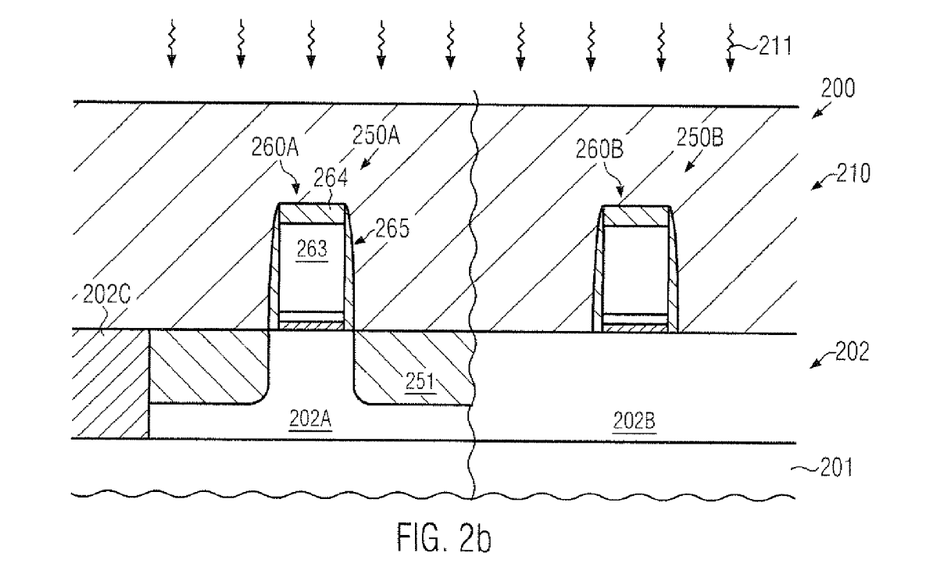

FIG. 2b schematically illustrates the semiconductor device 200 in a further advanced manufacturing stage. As shown, a sacrificial fill material 210 may be formed above the active regions 202A, 202B and the isolation structure 202C in such a way that the gate electrode structures 260A, 260B may also be embedded in the material 210. As discussed above, the fill material 210 may be provided as an appropriate organic material that may be applied on the basis of spin-on techniques in a low viscous state. Consequently, during deposition of the material 210, any spaces between even closely spaced gate electrode structures may be reliably filled with the material 210. It should be appreciated that also any gate electrode structures (not shown) formed on the isolation structure 202C, as is for instance described with reference to the device 100, may also be reliably embedded in the material 210. In some illustrative embodiments, the material 210 may be provided as a photosensitive material, or at least a material that may be removable on the basis of a wet chemical developer material after a corresponding treatment, such as a radiation treatment, a heat treatment and the like. For example, resist materials may be used as the fill material 210, such as positive resists or negative resists and the like. It should be appreciated that a plurality of corresponding organic materials are available and may be used as the sacrificial fill material 210. For example, the fill material 210 may be applied with a thickness of 100-300 nm for a gate height of approximately 50-100 nm. If the degree of planarity after the application of the material 210 by spin coating techniques is considered inappropriate, a superior planarized surface quality may be achieved by performing a mild polishing process and the like. After the application of the fill material 210, a treatment 211 may be performed so as to harden the material 210, thereby obtaining the desired mechanical and chemical stability. For example, the treatment 211 may include an exposure to radiation in the case of photosensitive material, thereby making the material 210 soluble in a wet chemical developer chemistry. In other cases, the treatment 211 may represent a heat treatment for curing the material 210, which may be soluble in a wet chemical developer solution which, however, may provide etch resistivity for a plurality of etch chemistries, as is, for instance, well known for negative photoresists and the like.

Figure 2C:
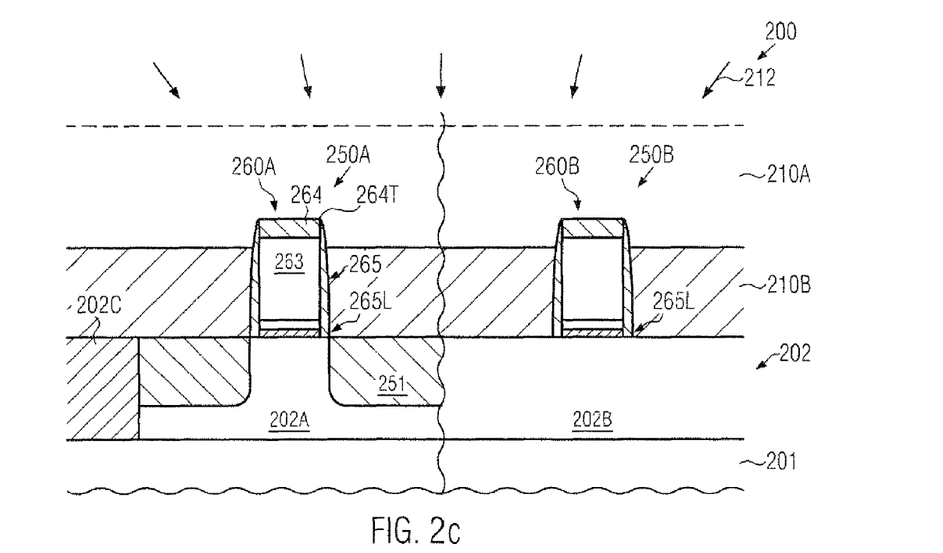

FIG. 2c schematically illustrates the device 200 in a further advanced manufacturing stage. As illustrated, a portion 210A of the sacrificial fill material 210 may be removed on the basis of an appropriate removal process 212, which in some illustrative embodiments may be performed as a wet developing process, which may thus represent a well-controllable removal process. In this case, the removal rate may be determined on the basis of the process parameter, such as temperature and duration of the developing process and by the characteristics of the developer solution, such as concentration, temperature thereof and the like. Furthermore, the removal rate may depend on the previous treatment and the characteristics of the material 210, for instance when a photosensitive material has been exposed during the treatment 211 (FIG. 2b) and the like. It should be appreciated that the removal rate during the process 212 may be efficiently determined on the basis of experiments, experience and the like. Consequently, due to the high degree of uniformity in applying the material 210 and due to the well-controllable removal of a portion thereof, such as a portion 210A, the dielectric cap layer 264, or at least a top surface 264T thereof, may be efficiently exposed during the process 212, while on the other hand a significant portion of the protective sidewall spacer structure 265 may be reliably covered by a remaining portion 210B of the sacrificial material 210. In particular, a lower portion 265L of the spacer structure 265, as well as the active regions 202A, 202B and the isolation structure 202C may remain covered by the portion 210B.

Figure 2D:
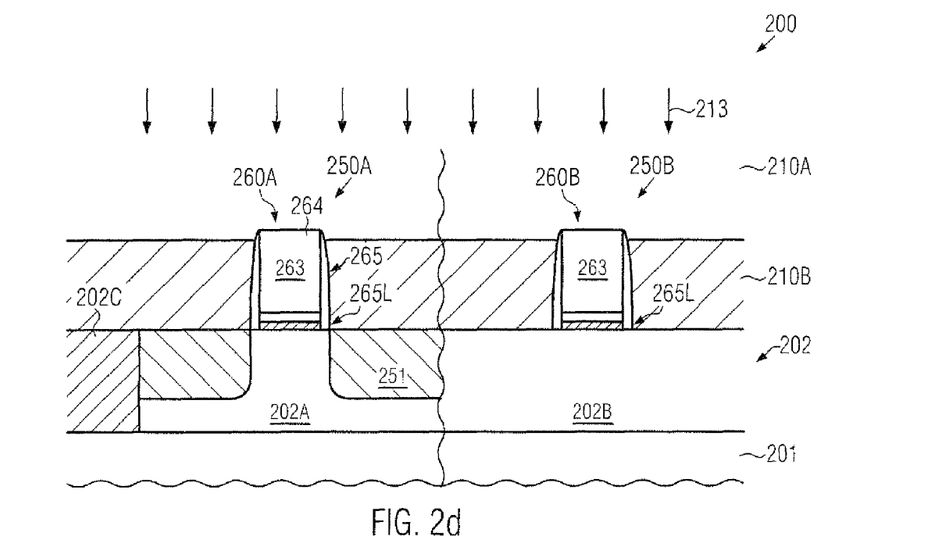

FIG. 2d schematically illustrates the semiconductor device 200 when exposed to a reactive etch ambient 213, in which the dielectric cap layer 264 (FIG. 2c) may be removed in the presence of the portion 210B, which may thus still reliably cover at least the lower portion 265L of the spacer structure 265. For example, the etch process 213 may be performed on the basis of hot phosphoric acid when the dielectric cap layer is comprised of silicon nitride material. In other cases, additional etch chemistries may be applied, such as hydrofluoric acid, when the dielectric cap layer 264 comprises silicon dioxide material, for instance in the form of a liner material formed above and/or below a silicon nitride material and the like. Due to the presence of the fill material 210B, the application of a corresponding etch recipe may be less critical, even if a certain material erosion may also take place in the fill material 210B. It should be appreciated that if the material 210B may have a similar etch rate as the dielectric cap layer to be removed, only the top surface thereof may be exposed during the process 212 of FIG. 2c so that, during the etch process 213, undue consumption of the spacer structure 265 may be suppressed. In other illustrative embodiments, the etch process 213 may be performed as a plasma assisted etch process for removing silicon nitride material selectively with respect to silicon material. For this purpose, a plurality of etch chemistries are available, as are also typically applied during the formation of silicon nitride-based spacer elements, such as the spacer structure 265. In this case, the silicon nitride etch process may result in the formation of a silicon oxide material upon exposing a silicon material, for instance the electrode material 263, thereby forming a self-limiting etch stop material. On the other hand, any oxide material may be removed afterwards by any appropriate cleaning recipe without contributing to a material loss in the isolation structure 202C due to the presence of the material 210B.

Figure 2E:
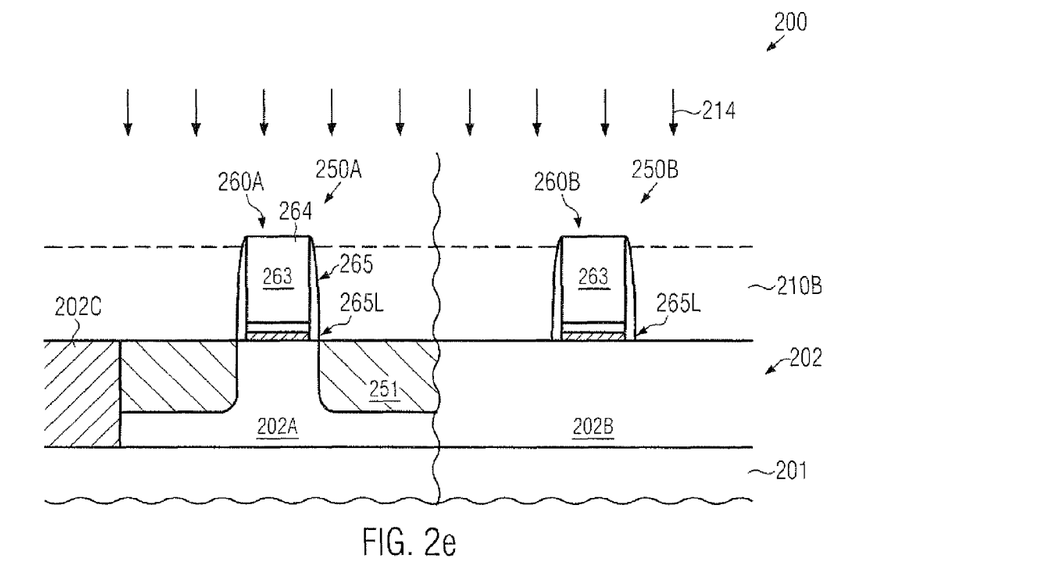

FIG. 2e schematically illustrates the semiconductor device 200 in a manufacturing phase in which a removal process 214 may be applied so as to remove the material 210B selectively with respect to the gate electrode structures 260A, 260B, selectively to the active regions 202A, 202B and selectively to the isolation structure 202C. To this end, well-established plasma assisted etch recipes may be applied, for instance on the basis of an oxygen plasma, as is typically used for removing resist material or other organic polymer materials. Consequently, the effect of the removal process 214 on exposed surface areas of the device 200 may be significantly less compared to plasma assisted reactive ion etch procedures or aggressive wet chemical etch processes so that any material loss in active regions 202A, 202B and in particular in the isolation structure 202C may be suppressed. Consequently, a superior surface topography in the active regions 202A, 202B and in particular in the isolation structure 202C may be achieved, since a corresponding etch process and removal process for forming sacrificial oxide spacers may be omitted. Furthermore, superior integrity of the spacer structure 265, in particular at the lower portion 265L thereof, may be achieved, thereby providing a high chemical resistivity of the portion 265L in view of the further processing, for instance in view of wet chemical cleaning processes, that may typically be required for the subsequent implantation sequences, for instance after removal of resist materials and the like.

Consequently, the further processing may be continued by forming drain and source extension regions and halo regions, if not yet provided, followed by the formation of a spacer structure and incorporating a dopant species for the drain and source regions. To this end, similar process strategies may be applied, as previously explained with reference to the semiconductor device 100.

Figure 2F:
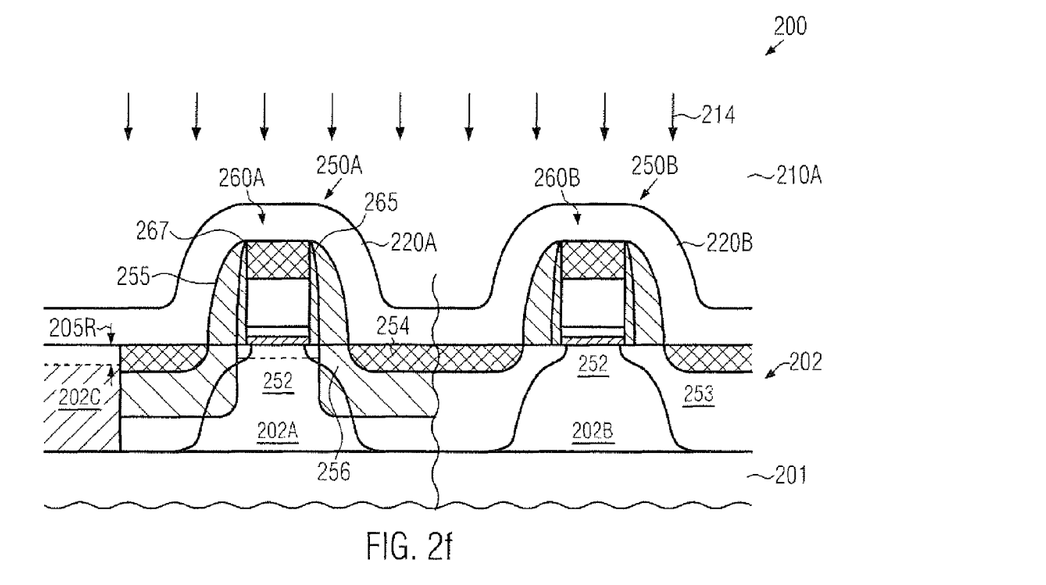

FIG. 2f schematically illustrates the semiconductor device 200 in a further advanced manufacturing stage. As illustrated, the transistors 250A, 250B may comprise drain and source regions 253 in combination with the extension regions 256, wherein a metal silicide 254 may also be provided in the drain and source regions 253. Furthermore, a sidewall spacer structure 255 having any appropriate configuration may be formed on the protective sidewall spacer structure 265, thereby defining a lateral offset of the drain and source regions 253 and of the metal silicide regions 254. Moreover, metal silicide regions 267 may be formed in the gate electrode structures 260A, 260B, thereby enhancing the overall conductivity thereof. Moreover, a dielectric material 220A may be formed above the transistor 250A and may, in some illustrative embodiments, represent a highly stressed dielectric material so as to induce a further strain component in the channel region 252 of the transistor 250A. Similarly, a dielectric material 220B may be formed above the transistor 250B and may be provided with a high internal stress level that may be appropriate for enhancing performance of the transistor 250B. It should be appreciated, however, that any other configuration of an interlayer dielectric material to be formed between the gate electrode structures 260A, 260B and above the transistors 250A, 250B may be applied.

The semiconductor device 200 as illustrated in FIG. 2f may be formed on the basis of similar process techniques as previously described. It should be appreciated, however, that the manufacturing processes may be performed with superior uniformity due to the significantly relaxed surface topography of the device 200 after the removal of the dielectric cap material of the gate electrode structures 260A, 260B. For example, after forming the drain and source regions 253, the exposed surface areas of the device 200 may be cleaned, for instance, on the basis of hydrofluoric acid and the like, thereby causing a certain degree of material loss 205R in the isolation structure 202C, which, however, may be significantly less compared to the conventional manufacturing regime since the pronounced material loss caused by the sacrificial spacer removal may be avoided. Consequently, the relaxed surface topography may enable the deposition of the layers 220A, 220B with an increased thickness, which may be advantageous in obtaining superior strain conditions at one or both of the transistors 250A, 250B, as previously explained.

As a result, the present disclosure provides manufacturing techniques in which superior integrity of sensitive gate materials may be accomplished on the basis of a protective spacer structure, wherein a width of the spacer structure may be selected so as to obtain superior strain conditions in certain transistors, when a strain-inducing semiconductor material is to be formed in the active region. The integrity of the spacer structure may be preserved on the basis of a sacrificial fill material, which may substantially suppress any undue interaction of a reactive etch chemistry with the spacer structure during the removal of a dielectric cap material of the high-k metal gate electrode structures. For example, the fill material may be provided as an organic material that may be appropriately reduced in thickness on the basis of a wet chemical development process, thereby providing well-controllable process conditions in exposing the dielectric cap material, while maintaining the lower portion of the spacer structure reliably covered by the fill material. On the other hand, the fill material may be removed with superior selectivity, in particular with respect to isolation structures, thereby significantly reducing the degree of material loss. Consequently, superior transistor performance and reduced yield losses in sophisticated semiconductor devices may be accomplished in a process strategy in which the work function of the high-k metal gate electrode structures may be adjusted in an early manufacturing stage.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a gate electrode structure of a transistor above a semiconductor region of a semiconductor device, said gate electrode structure comprising a gate insulation layer comprising a high-k dielectric material, a metal-containing cap material formed on said gate insulation layer, an electrode material formed above said cap material, a dielectric cap layer formed above said electrode material and a sidewall spacer structure;
    forming a sacrificial fill material above said semiconductor region and covering said gate electrode structure;
    removing a portion of said sacrificial fill material so as to expose at least a top surface of said dielectric cap layer and a side surface of said sidewall spacer structure;
    removing said dielectric cap layer from above said electrode material in the presence of a remaining portion of said sacrificial fill material;
    removing said sacrificial fill material;
    forming drain and source regions in said semiconductor region after removing said sacrificial fill material; and
    forming a strain-inducing dielectric material above said drain and source regions and said gate electrode structure.

2. The method of claim 1, wherein forming said sacrificial fill material comprises depositing an organic material so as to provide a substantially planar surface.

3. The method of claim 2, wherein said organic material is a photosensitive material.

4. The method of claim 1, further comprising forming drain and source extension regions prior to forming said sacrificial fill material.

5. The method of claim 1, wherein removing said sacrificial fill material comprises performing a strip process by using an oxygen plasma.

6. The method of claim 1, wherein removing said dielectric cap layer comprises performing a wet chemical etch process.

7. The method of claim 1, wherein removing said dielectric cap layer comprises performing a plasma assisted etch process.

8. The method of claim 1, further comprising forming a strain-inducing semiconductor alloy in said semiconductor region in the presence of said gate electrode structure and using said dielectric cap layer and said sidewall spacer structure as a mask.

9. The method of claim 1, further comprising forming a semiconductor alloy on said semiconductor region prior to forming said gate electrode structure.

10. A method, comprising:
    forming a gate electrode structure of a transistor above a semiconductor region of a semiconductor device, said gate electrode structure comprising a gate insulation layer comprising a high-k dielectric material, a metal-containing cap material formed on said gate insulation layer, an electrode material formed above said cap material, a dielectric cap layer formed above said electrode material and a sidewall spacer structure;
    forming a sacrificial fill material above said semiconductor region and covering said gate electrode structure comprising depositing a photosensitive organic material so as to provide a substantially planar surface;
    removing a portion of said sacrificial fill material so as to expose at least a top surface of said dielectric cap layer and a side surface of said sidewall spacer structure, wherein removing a portion of said sacrificial fill material comprises exposing said sacrificial fill material to radiation and performing a developing process;

removing said dielectric cap layer from above said electrode material in the presence of a remaining portion of said sacrificial fill material;

removing said sacrificial fill material;

forming drain and source regions in said semiconductor region after removing said sacrificial fill material; and forming a strain-inducing dielectric material above said drain and source regions and said gate electrode structure.

11. A method of forming a transistor of a semiconductor device, the method comprising:

forming a gate electrode structure on an active region of said transistor, said gate electrode structure comprising a patterned material stack and a sidewall spacer structure formed on sidewalls of said patterned material stack, said patterned material stack comprising a high-k dielectric material, an electrode material, and a dielectric cap layer;

forming a sacrificial fill material above said gate electrode structure and said active region;

exposing at least a portion of said dielectric cap layer and a side surface of said sidewall spacer structure by removing a portion of said sacrificial fill material by performing a wet developing process;

removing said dielectric cap layer from said gate electrode structure selectively to a remaining portion of said sacrificial fill material;

removing said remaining portion of said sacrificial fill material;

forming drain and source regions in said active region; and forming a strain-inducing dielectric material above said drain and source regions and said gate electrode structure.

12. The method of claim 11, further comprising forming a strain-inducing semiconductor material in said active region by using said sidewall spacer structure as a growth mask.

13. The method of claim 11, further comprising forming drain and source extension regions prior to removing said dielectric cap layer.

14. The method of claim 11, wherein forming said gate electrode structure comprises providing a work function metal species in said electrode material prior to forming said sacrificial fill material.

15. A method of forming a semiconductor device, the method comprising:

forming a first gate electrode structure above a first active region and a second gate electrode structure above a second active region, said first and second gate electrode structures comprising a dielectric cap layer, wherein forming said first and second gate electrode structures comprises incorporating a first work function metal in said first gate electrode structure and a second work function metal in said second gate electrode structure;

forming a first spacer structure from a spacer layer selectively on sidewalls of said first gate electrode structure and preserving a portion of said spacer layer so as to cover said second gate electrode structure and said second active region;

forming a strain-inducing semiconductor material in said first active region by using said first spacer structure, said portion of the spacer layer and said dielectric cap layer as a mask;

forming a second spacer structure on sidewalls of said second gate electrode structure from said remaining portion of said spacer layer;

after forming said first work function metal in said first gate electrode structure and said second work function metal in said second gate electrode structure, forming a sacrificial fill material so as to cover said first and second active regions and laterally enclose said first and second gate electrode structures while exposing at least a portion of said dielectric cap layer;

removing said dielectric cap layer from said first and second gate electrode structures by using said sacrificial fill material as an etch mask;

removing said sacrificial fill material selectively to said first and second active regions and selectively to an isolation structure laterally delineating said first and second active regions; and forming drain and source regions in said first and second active regions.

16. The method of claim 15, wherein forming said sacrificial fill material comprises depositing an organic material and removing a portion thereof by performing a wet development process.

17. The method of claim 15, further comprising forming a metal silicide in said drain and source regions and in said first and second gate electrode structures.

* * * * *